United States Patent [19]

Crissy

[11] 4,104,071

[45] Aug. 1, 1978

[54] METHOD FOR ORGANIZING AND PREPARING PHOTOGENERATED PRINTING MEDIA

[75] Inventor: Robert J. Crissy, West Caldwell, N.J.

[73] Assignee: Powers Chemco, Inc., Glen Cove, N.Y.

[21] Appl. No.: 297,367

[22] Filed: Oct. 13, 1972

[51] Int. Cl.² .................. G03C 5/04; G03B 27/44
[52] U.S. Cl. ............................ 96/41; 355/54
[58] Field of Search ............ 355/54, 64; 33/184.5; 96/41

[56] References Cited

U.S. PATENT DOCUMENTS

| 1,124,531 | 1/1915 | Saltzman | 33/184.5 |
|---|---|---|---|
| 3,115,057 | 12/1963 | Lemche | 355/64 |
| 3,286,586 | 11/1966 | Whitney | 355/54 |
| 3,299,972 | 1/1967 | Walter et al. | 355/64 |

Primary Examiner—Edward C. Kimlin
Assistant Examiner—L. Falasco

[57] ABSTRACT

A method and apparatus for organizing and preparing photogenerated printing media for multi-page printing including a method and the apparatus for carrying out the method in which the sequence in which the proof pages of the pages to be printed are to be sorted and arranged, are recorded on a film strip and the film strip is transorted through a viewer. The film strip is viewed through a viewer and the pages are sorted and arranged. The sorted and arranged papers are then affixed to segments of a conveyer sheet advanced through a paste-up machine. The sheet, after the proof pages have been affixed thereto is transported across a copy board and the images of the copy to be printed and which appear on the proof pages affixed to the conveyer sheet are photographically reproduced on a strip of roll film advanced through a camera. The film is then processed and the processed film is used to photosensitize printing plates.

1 Claim, 17 Drawing Figures

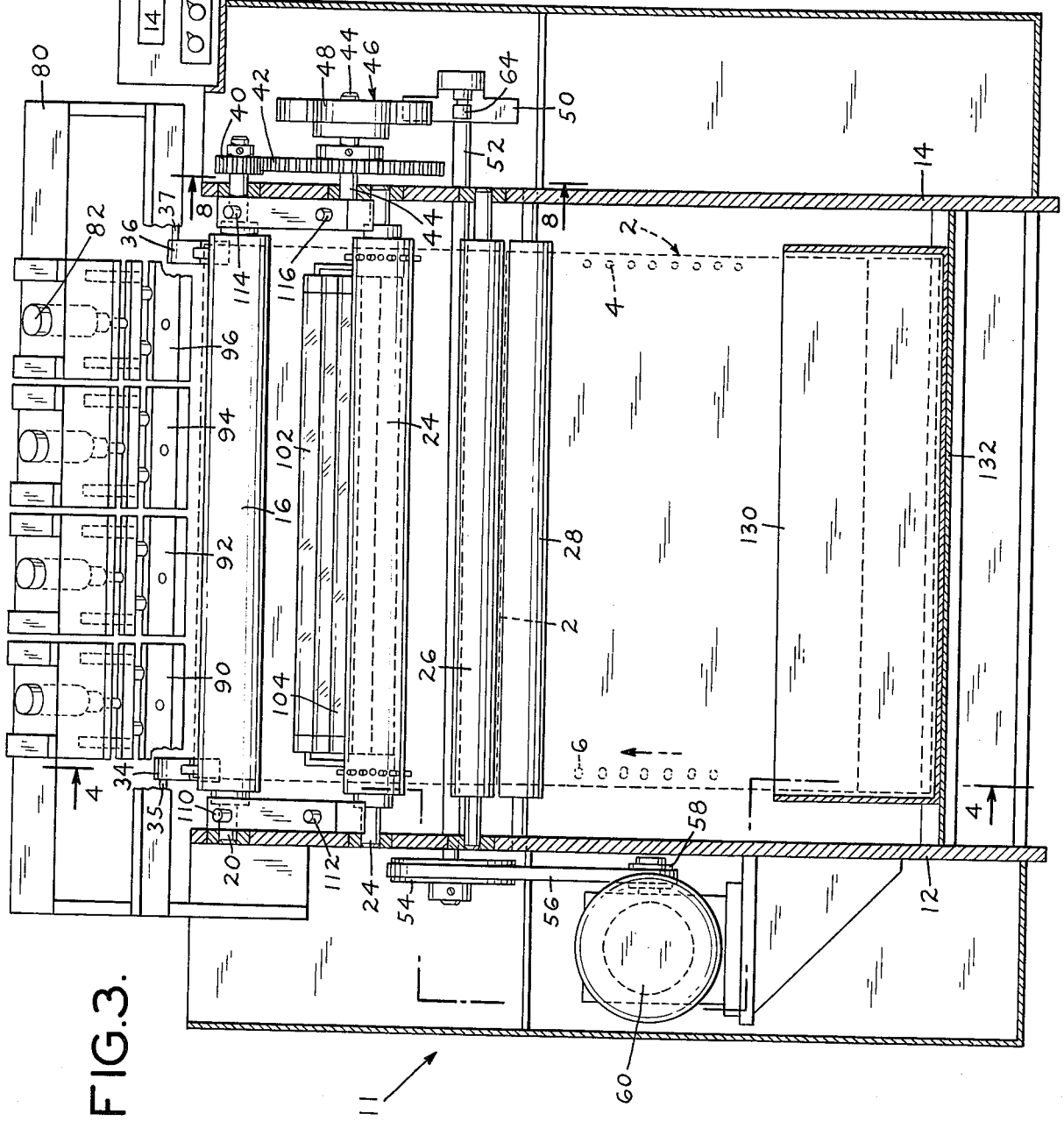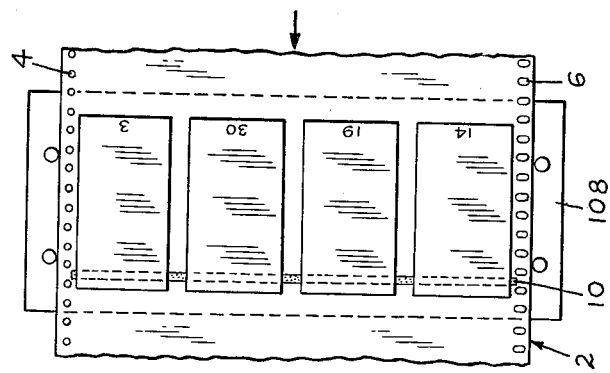

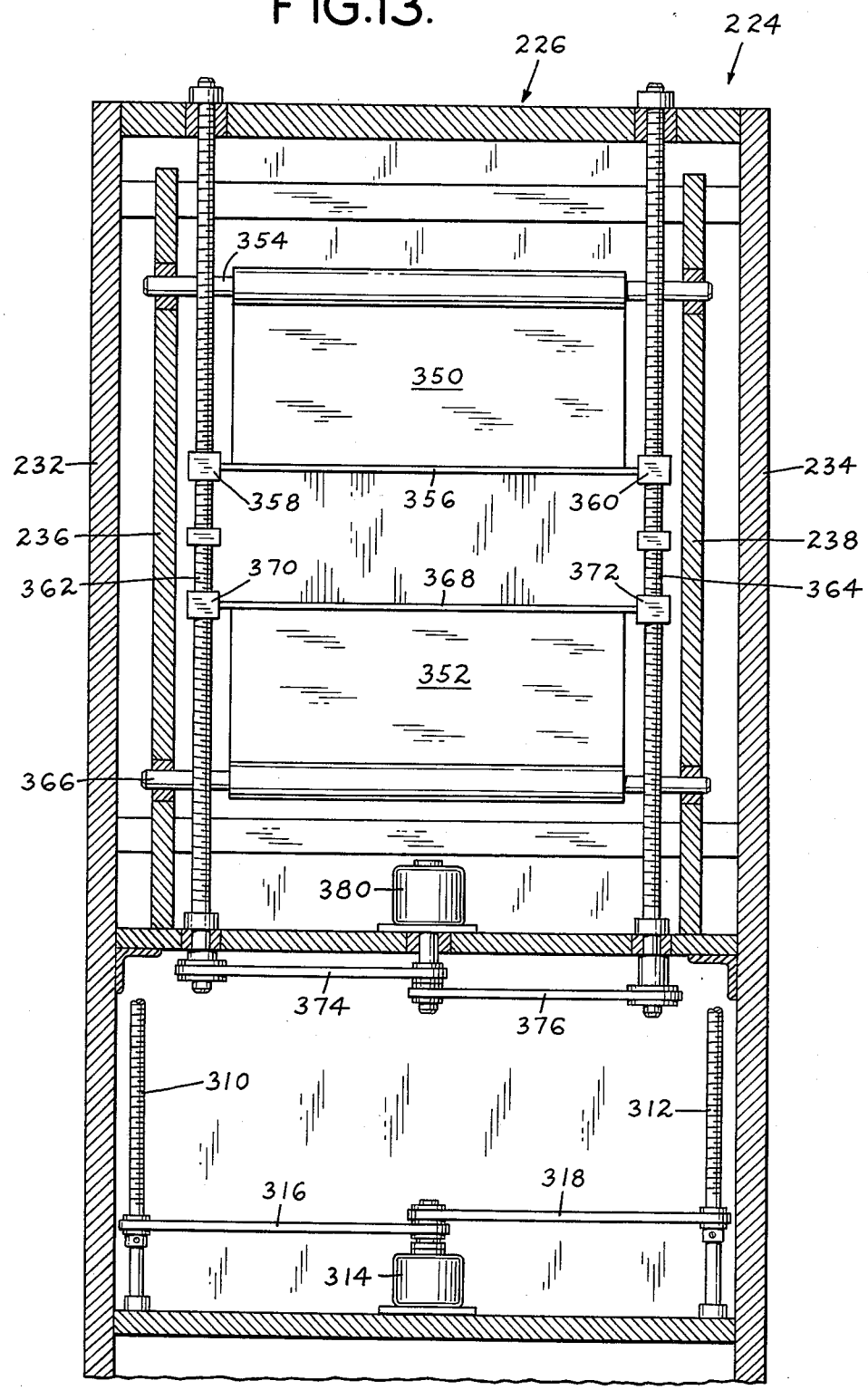

METHOD FOR ORGANIZING AND PREPARING PHOTOGENERATED PRINTING MEDIA

This invention relates to the organization and preparation of photogenerated printing media for different image multi-page printing, such as in the printing of books, directories, catalogs, business forms and the like, and, more particularly to the photosensitive film, conveying media, apparatus and methods for compiling and assembling printing media for book signatures and other imposition for use in such multi-image printing.

It is common practice in multi-image printing, such as in the printing of books, to print a plurality of the book pages on a single sheet. After printing the single sheets are folded, bound and trimmed in such a manner that, in the bound book, the printed book pages appear in the book in proper sequence, proper location and with the pages facing in the desired direction. The single sheet, with the plurality of book page impositions printed thereon, commonly referred to as a signature imposition, may be printed with a plate or cylinder photographically sensitized and exposed from a lay-out of negative pages of the book to be printed. There are many different and varying arrangements of page lay-outs required for signature imposition and many reasons for such varying arrangements. Among such reasons are the number of pages which will be included in the book to be printed, the number of unnumbered pages which will precede the regularly numbered pages of text, the number of half tone pictures, maps, graphs, charts, tables which will appear and their location throughout the book, the number of index pages and unnumbered pages to be included at the end of the book following the text pages and varying and sundry other reasons such as press size and folding facilities. Many of the varying arrangements of book signature impositions is graphically presented in "Lay-outs For Flat-bed Rotary And Web Press Impositions," published by the U.S. Government Printing Office.

Because of the varying lay-outs of pages for signature impositions, proper planning and proper execution of the lay-out is critical to the multi-image printing operation. If, in planning or execution, one or more pages is misplaced or is placed on the lay-out in the wrong direction, such page or pages will not properly appear in the book. Because of possible errors in the planning and execution of lay-outs and cost of preparing sensitized plates, it is common practice in printing books to prepare blueprints from negative signature imposition lay-outs before affecting photo exposure on printing plates. Such blueprints are folded, bound and trimmed and the blueprint copy of the book is checked for errors. Any errors appearing in the blueprint book copy are corrected on the negative lay-outs before such lay-outs are utilized in the preparation of the photographically sensitized printing plates.

Apart from the planning and execution of the lay-outs, prior to the instant invention, the preparation of lay-outs for use in photographically generated printing plates has, for the most part, been an expensive and time-consuming operation. In such preparation, it has been the usual practice to make a photographic negative of each book page and place such negatives at precise, pre-planning positions on a large photo opaque paper or plastic sheet positioned over a light table. A template, or markings on the sheet or table, are followed in placing each of the photographic negatives on the large photo opaque sheet. The book page negatives are fastened to the photo opaque sheet with transparent adhesive tape. After all of the page negatives are in place and securely taped, the larger sheet is turned over. The areas of the larger sheet under or behind each of the page negatives is cut out and removed. This operation is commonly referred to as "stripping." After stripping, the sheet is touched up with a liquid opaque material to eliminate light holes and light strips in the page negatives. The large photo opaque sheets required for these operations are bulky, unstable and difficult to handle and store, are easily damaged and require relatively large areas for working and storage. Furthermore, the stripping operation consisting of placing, taping and touching up of such sheets is tedious, time-consuming, expensive and prone to error.

Under the present invention, the planning, execution and preparation of lay-outs for signature impositions and the like for multi-image printing is substantially reduced by a programmed procedure. Much smaller working areas are required, and the lay-outs, once produced, can be readily handled, stored and, if desired, re-used. Negative page mounting, taping, and cutting out of areas or windows and other stripping operations are eliminated. Furthermore a substantial amount of the touch-up heretofore required to avoid light holes and strips is eliminated.

In the instant invention, special roll film, special original image conveyor media, apparatus and methods are utilized. Book proof pages to be photographed for printing are successively numbered serially with an ink which will not photographically reproduce. The serially numbered pages are sorted, arranged and stacked in a predetermined programmed sequence. The sorted and stacked pages are then accurately positioned on and fastened to a special conveying media. As this is being done, each page is checked against the original predetermined programmed sequence. Any errors that may have occurred in the sorting and stacking of the pages are corrected.

After the pages have been placed on and fastened to the special conveying media, the conveying media with the attached pages fastened thereto is fed to a copy or viewing board. The segments of the conveying media are successively registered, one after the other, upon the face of the copy board. Each successively fed segment is stopped on the copy board for a pre-set time interval and photographed. The following segment is then fed onto the copy board, stopped and photographed. These steps are repeated to photographically record all the pages of the book.

The conveyor media utilized in the instant invention is of an air pervious material and, preferably, is of a light reflective color which, when photographed, will not result in a contrasting background on the film negative. The copy board has an air pervious surface. When the carrier media segment is transported over and stopped on the copy board, a vacuum is applied through the air pervious copy board surface. The conveyor media and page copy thereon are drawn into flat contact with the copy board surface by the vacuum. Each segment is successively photographed, in a manner to be described, without producing shadow lines, distortions, out-of-focus areas and the like, on the photographic film.

In the instant invention, the copy board is mounted on a bed and a camera is mounted opposite to the copy board. The copy board with the conveyor media thereon faces and is in focused alignment with the camera and camera lens. The camera in the instant invention utilizes roll film. The camera and copy board feed are phase actuated. When the conveyor media, with the book page proof copy fastened thereto is serially step transported, segment by segment, across the copy board, a pre-set length of film is transported from the roll of film in the camera. The film is stopped, retained flat by vacuum and photographically exposed while the conveyor media segment is in stop position on the copy board and held in contact with such board by the copy board vacuum.

The length of film transported and stopped for exposure as each segment of the conveyor media is transported and stopped is controlled in the camera, as will be later described. Thus, the photo reproductions of the book proof page copy on such film, after such film has been exposed and developed, are located and spaced on such film in precise position. Hence, when the film has been exposed and developed, such film is utilized for preparing the blueprint proof copy and the photographically sensitizable printing plate. Stripping and taping of film negatives on a large film or paper sheet with the costs and inconveniences heretofore encountered therewith are eliminated.

For purposes more apparent from the description hereinafter, the marginal edges of the conveyor media are perforated for registry with transport pins on the apparatus utilized in the instant invention. Such perforations and the transport of the conveyor media with the pins provides the necessary registry and alignment of the conveyor media and control of the transport thereof. The roll film in the camera is also perforated along its marginal edges for registry and alignment with transport pins in the camera to assure proper alignment and precise transport of the roll film. For reasons explained later herein, certain of the perforations along the marginal edge of the roll film are elongated so that, when exposed and developed, sections of such roll film may be mounted in side by side arrangement in a jig for the making of blueprints, if desired, and the exposure of large printing plates.

The instant invention will be better understood from the following description of the preferred embodiment, and the attached drawings in which:

FIG. 3 is a front view, partly in section, of the paste-up apparatus of the instant invention;

FIG. 5 is a view of a segment of the conveyer media of FIG. 1 as such segment is in bond position on the paste-up apparatus of FIGS. 3 and 4;

FIG. 13 is a front view, from the lens end, of the camera of FIG. 10 with portions of the camera apparatus omitted;

Figure 2:
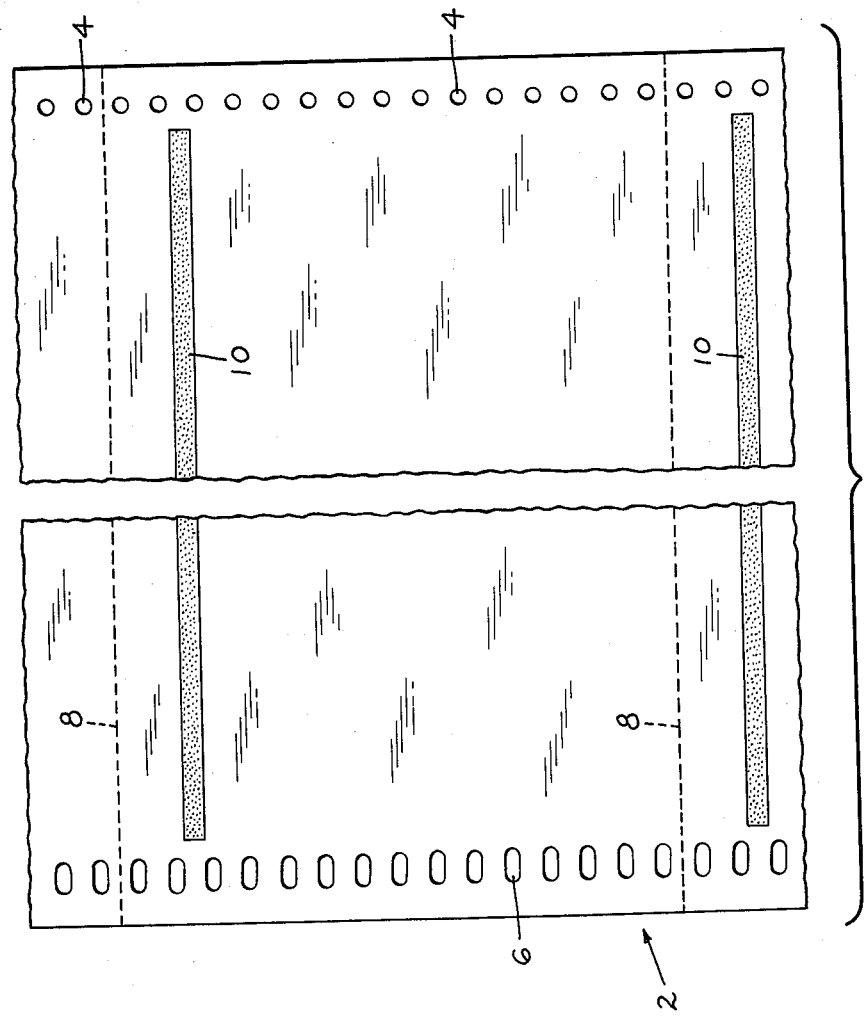
FIG. 2 is an enlarged view of the conveyer media of FIG. 1 with the page copy removed.

Referring to the drawings and, particularly, FIGS. 1 and 2 thereof, the conveyer media, generally designated 2, is made of air pervious material, such as paper, and is of a color, such as white, which is reflective and, when photographed with the page copy thereon, as later described, will produce little, if any, contrasting background reproduction. Along its opposite edges, conveyer media 2 has equally longitudinally spaced perforations 4 and 6. Perforations 4, along one longitudinal side edge, are of equal size, and, preferably, are circular. Perforations 6 along the opposite side edge are in transverse alignment with perforations 4 and are elongated in the transverse direction of conveyer media 2 for reasons more apparent later herein. Conveyer media 2 is folded or creased at 8 into uniform segments so that when folded, as shown in the lower portion of FIG. 1, such segments fold one upon the other into an accordian stack. Along such folds 8, the conveyer media may be perforated so that, between the segments, the conveyer media material may be weakened, such as, by partially cutting the material transversely at folds 8. Such weakening of the material at fold lines 8 should not be so great as to interfere with normal handling and feeding of conveyer media 2 as a continuous strip but should allow pulling of the segments apart without tearing or ripping of the segments between the fold lines.

As best shown in FIG. 2, each segment of conveyer media 2, intermediate folds 8, is provided with a transverse strip of adhesive 10, preferably a heat and pressure sensitive adhesive. Adhesive strip 10 is coated onto the conveyer media material and may be a continuous strip, a discontinuous strip, or may be applied in dots or may be in any other form suitable for attaching the page copy to the conveyer media for purposes hereinafter described. Adhesive strips 10 are positioned on each segment in relatively precise position with regard to folds 8. Preferably, the adhesive material utilized for this purpose is such that, when the media and page copy is photographed, no reproduction of such adhesive strip will appear on the photographic negative.

Figure 4:
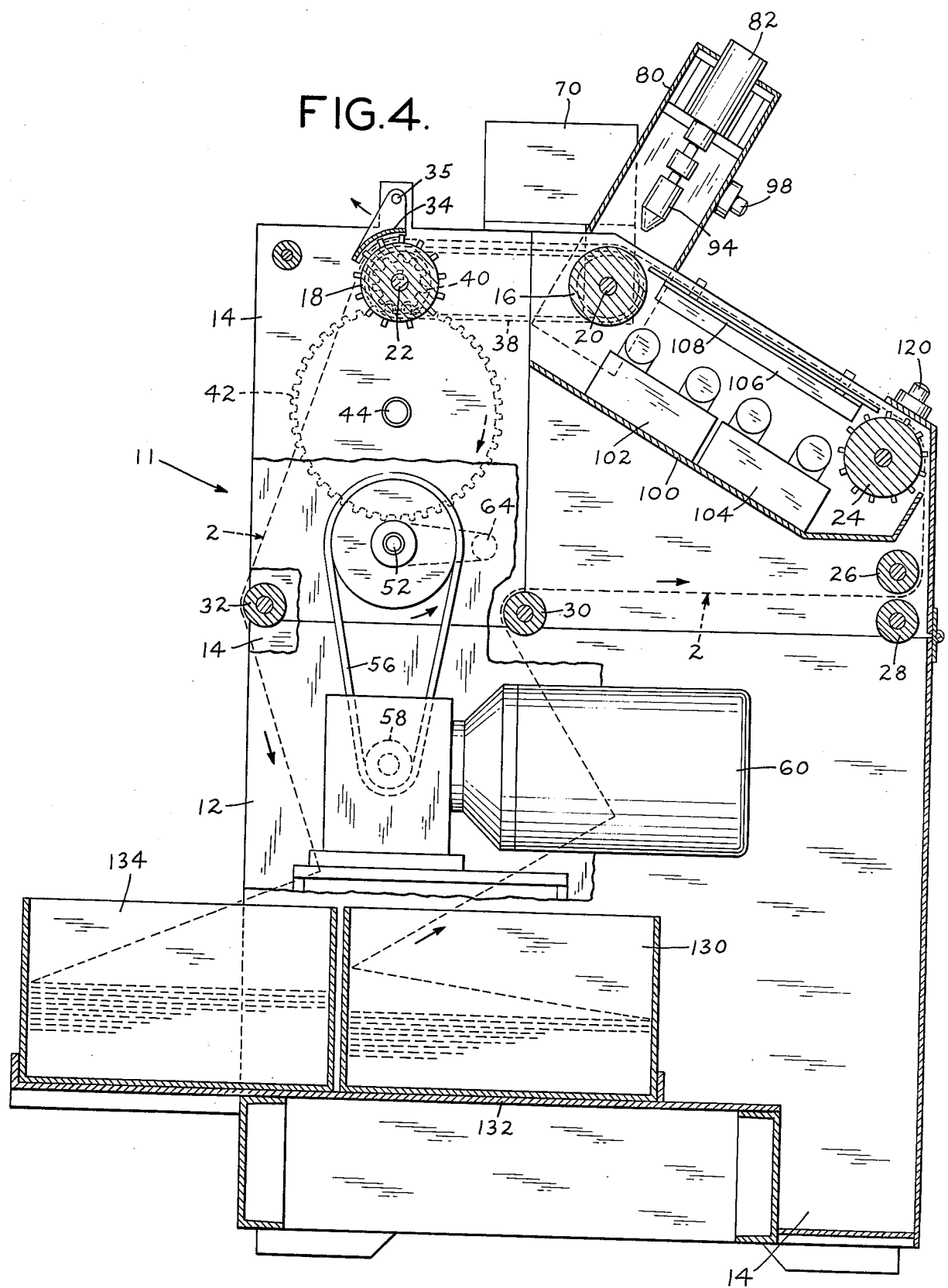
FIG. 4 is a side view partly in section of the apparatus of FIG. 3, taken at line 4—4, FIG. 3.

Referring now to FIGS. 3 and 4, the paste-up apparatus of the instant invention includes a frame, generally designated 11, having side members 12, 14. Drive rollers 16, 18 are mounted, respectively, on shafts 20, 22 which, in turn, are mounted on suitable bearings in side frame members 12, 14. At the opposite ends, rollers 16, 18, are provided with pins for purposes later described. Transport roller 24 is mounted at its opposite ends in suitable bearings mounted in side frame members 12, 14. Rollers 26, 28, FIG. 3, and 30, 32, FIG. 4, are also mounted at their opposite ends in bearings in side frames 12, 14. Paper keepers 34, 36, are pivotally mounted at 35, 36, to side frame member 12, 14, respectively, and hold conveyer media 2 on the pins.

Figure 8:
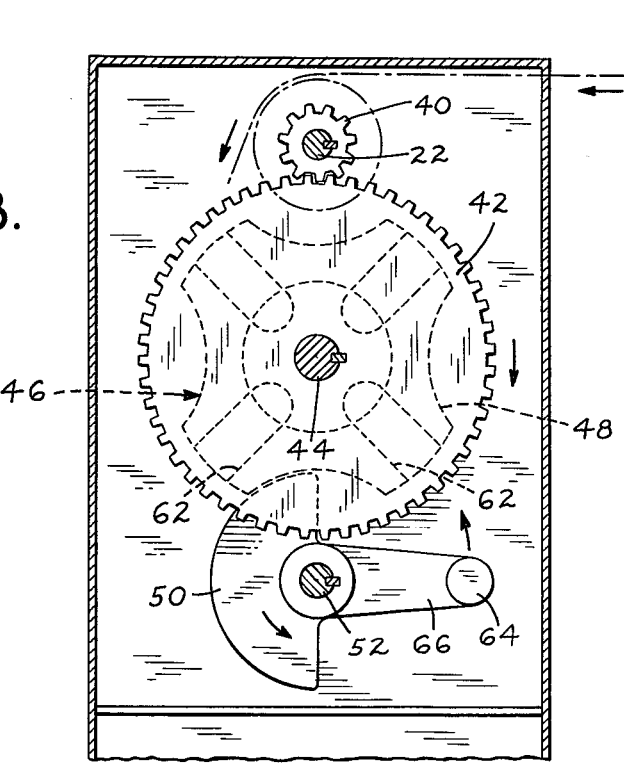
FIG. 8 is an enlarged view of a portion of the machine of FIG. 3 taken at line 8—8, FIG. 3.

As best shown in FIG. 4, rolls 16, 18 are interconnected by belt 38. Gear 40, FIGS. 3, 4, and 8, is keyed to shaft 22 of roller 18 and is in mesh with gear 42, keyed to shaft 44 mounted on a bearing in side frame member 14. Geneva starwheel 46 is also keyed to shaft 44. Geneva starwheel 46 has arcuate shape recesses 48 around its periphery for receiving arcuate shaped disc of drive 50 mounted on shaft 52. Shaft 52 is mounted on bearings in side frame members 12, 14. At its opposite end, FIG. 3, shaft 52 is splined to pulley 54, driven by belt 56, connected by pulley 58 to motor 60. Intermediate arcuate recesses 48, Geneva 46 has slots 62 into which roller 64, mounted on arm 66 keyed to shaft 52, engages as arm 66 is rotated by motor 60 through shaft 52. Through this Geneva drive arrangement, gear 40 on shaft 22 is intermittently driven by gear 42 to drive rollers 18, 16 through a predetermined feed cycle and to stop the drive rollers. Such intermittent drive feeds the segments of conveyer media 2 through the paste-up apparatus.

Microfilm viewer, generally designated 70, having a viewing screen 72 and controls 74, is mounted on shelf 75 of the paste-up apparatus for purposes later described.

Sealing frame 80, carries air cylinders 82, 84, 86, and 88. Air cylinders 82, 84, 86, 88 are connected, respectively, to heated pressure sealing plates 90, 92, 94, 96 and each air cylinder is connected to a manual actuating button, such as button 98 mounted on frame 80. For purposes better described, the actuating buttons face the front of the machine and each cylinder is manually actuating.

Light box 100, having an illuminating source, such as fluorescent units 102, 104, is mounted on side frame members 12, 14, in front of air cylinder frame 80. At its top, light box 100 has a translucent cover 106, such as frosted glass, which, as will be later described, provides the work surface for the paste-up operation. Template 108, FIGS. 4 and 5, is mounted over transparent cover 106 on pins 110, 112 on side frame member 12 and pins 114, 116 on side frame member 14. Manual button 120 is mounted below and to one side of transparent cover 106 and is connected to motor-clutch 60. When pressed and released, button 120 actuates motor-clutch 60 through one cycle to advance one segment of the conveyer media across the work surface of cover 106.

Supply box 130 is mounted on plate 132 and take-up box 134, FIG. 4, is mounted behind box 130 on plate 132.

In the operation of the paste-up machine in FIGS. 3, 4 and 8, an accordian folded supply of conveyer media 2 is placed in supply box 130 and box 130 with the accordian folded supply of conveyer media therein is placed in position on plate 132. The leading edge of the accordian folded conveyer media 2 is threaded through the machine, over guide roll 30, between rolls 26, 28 and over pin rolls 24, 18, the leading edge of conveyer media 2 being fed between pin roll 18, all in the direction of the arrows in FIG. 4. In threading conveyer media 2 through the machine and engaging perforations 4, 6, adjacent the marginal edges of media 2 with the pins on rollers 24, 18, it is important that, before the perforations are engaged with the pins, the conveyer media segment positioned on the work surface of translucent cover 106 be positioned so that adhesive strip 10 on such segment is in alignment with plates 90, 92, 94, 96. This alignment can be accomplished by providing suitable markings on the template. Alignment of pressure-sensitive adhesive strip 10 with plates 90, 92, 94, 96 is not only important to the operation of the paste-up machine but, as will be later explained, is important to proper registry of the book proof pages for subsequent use of the book proof pages.

Once conveyer media 2 has been threaded and aligned, the paste-up operation can commence. As heretofore described, the book proof pages to be positioned and affixed to conveyer media 2 on the paste-up machine have been serially numbered with a nonphotographing media, such as certain blue color inks, and the pages have been sorted and arranged in the sequence in which such book proof pages are to be positioned and affixed to conveyer media 2.

The numbering, sorting and arrangement of the book proof pages, in the method of the instant invention, is done manually before paste-up in the paste-up machine commences. The person who will do the sorting and arrangement of the book proof pages is provided with a pre-recorded tape and tape viewer, such as a pre-recorded microfilm and microfilm viewer, such as generally designated 70 in FIGS. 3 and 4. The page sequence and page direction to be followed in sorting and arranging the copy pages is pre-recorded on the microfilm and read with the viewer. By advancing the microfilm from a supply reel onto a take-up reel in the viewer in pre-determined increments, the pre-recorded microfilm can be viewed and the pre-recorded sorting and book proof page arrangement can be followed by the sorter in sorting and arranging the book proof pages. The sorted and arranged book proof pages are stacked one on top of the other and, for storage and transportation, this may be done into a box. The sorted and arranged book proof pages and the pre-recorded microfilm are delivered to the paste-up machine operator. The pre-recorded microfilm has been, of course, rewound onto a supply roll and the microfilm supply roll, with the pre-recorded film thereon, is positioned by the operator, in microfilm viewer 70. The microfilm is then advanced in viewer 70, by manual operation of the appropriate control 74, so that book proof page sequence followed by the sorter in the original sorting and arrangement of the book proof pages will be projected onto viewing screen 72 as viewer 70 is incremented. Controls 74 are then locked by the paste-up machine operator.

When the sorted, arranged and stacked book proof pages are delivered to the paste-up machine operator, supply box 130 and take-up box 134 have been positioned on the paste-up machine and conveyer media 2 has been threaded through the paste-up machine. One segment of conveyer media 2 is on the working surface of transparent cover 106 with adhesive strip 10 in proper registry and alignment with heated pressure sealing plates 90, 92, 94, 96. The microfilm in viewer 70 is then advanced, by manual operation of another of the controls 74, so that the pre-recorded arrangement of the book proof pages to be affixed to the first segment of conveyer media 2 is projected onto viewing plate 72. Controls 74 are again locked so that, each time the paste-up machine is actuated by the operator to advance a following segment of conveyer media 2 onto translucent cover 106, the following page increment on the microfilm will be projected on viewing screen 72.

The paste-up machine operator takes the first book proof page from the top of the stack, views the page image sequence and page direction projected onto viewing screen 72 on microfilm views 70 to verify the page sorting and places such page, if properly sorted, in position on the segment of conveyer media 2 on the work surface of cover 106. The operator aligns the book proof page with the markings on template 108. After aligning the proof page with the template markings, the operator manually operates actuator button 98 connected to the air cylinder at the page location. The heated pressure sealing plate connected to such air cylinder advances downwardly into contact with the book proof page and presses the edge of the page against the adhesive. This activates such adhesive and affixes the book proof page to the segment of conveyer media 2. The operator then removes the following book proof page from the sorted and arranged stack, verifies the sorting and arrangement of the page with the page image and direction sequence projected onto viewing screen 72, aligns such page with the template markings and manually actuates the button 98 at the location of such page. This operation is repeated by the paste-up machine operator for each of the stacked, sorted, and arranged book proof pages.

Figure 1:
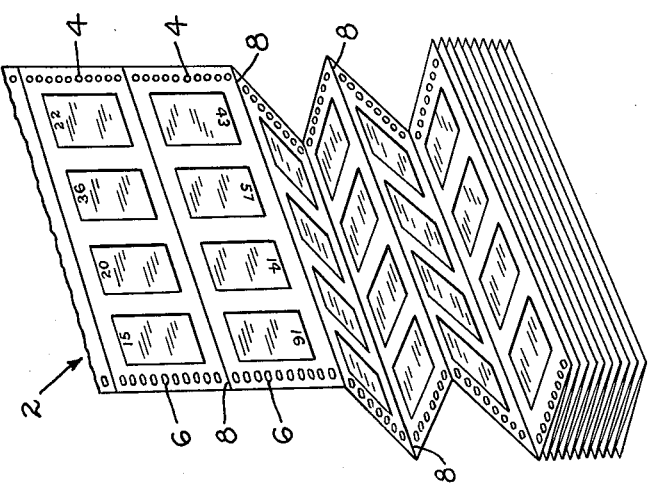
FIG. 1 is a perspective view of the conveyer media of the instant invention with page copy affixed thereto.

As is shown in FIGS. 1 and 5, a plurality of book proof pages are arranged and adhesively affixed transversely across each segment of conveyer media 2. The number of proof pages which will be adhesively affixed transversely across each segment will depend upon the size of the book page. Different templates can be provided for different page sizes.

After the required number of proof pages have been transversely positioned, aligned and affixed to the conveyer segment, the paste-up machine operator manually presses and releases button 120. Motor 60 is operated through one cycle and advances the following segment of conveyer media 2 into registered paste position on the work surface of translucent cover 106. The manual pressing and releasing of button 120, at the same time that the following segment of conveyer media 2 is being advanced, advances the next following proof page image sequence, pre-recorded on the microfilm and in viewer 70 into position so that the next following sequence is projected onto viewing screen 72. The paste-up machine operator then pastes up this segment in the same manner as the preceding segment, verifying the sorting and arrangement of each book proof page before the page is affixed to the segment. As the attached segments of conveyer media 2 have been pasted with the book proof pages and advanced from the work surface of translucent cover 106, such attached segments advance and are accordian folded into take-up box 134. The paste-up operation is continued until all of the sorted, arranged and stacked book proof pages have been verified and affixed to the conveyer media.

Figure 6:
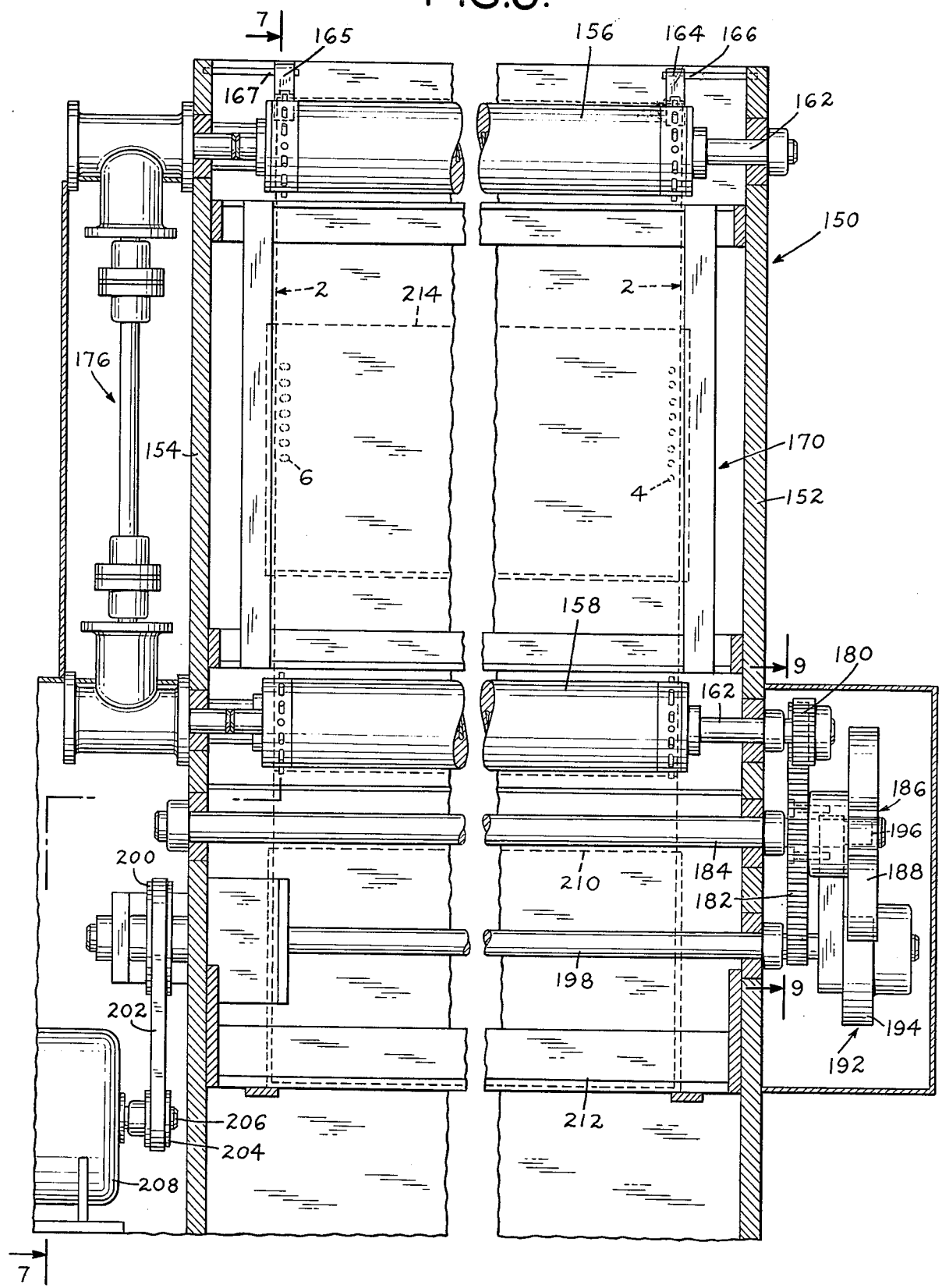
FIG. 6 is a front view, partly in section, of the copy board apparatus of the instant invention.
Figure 7:
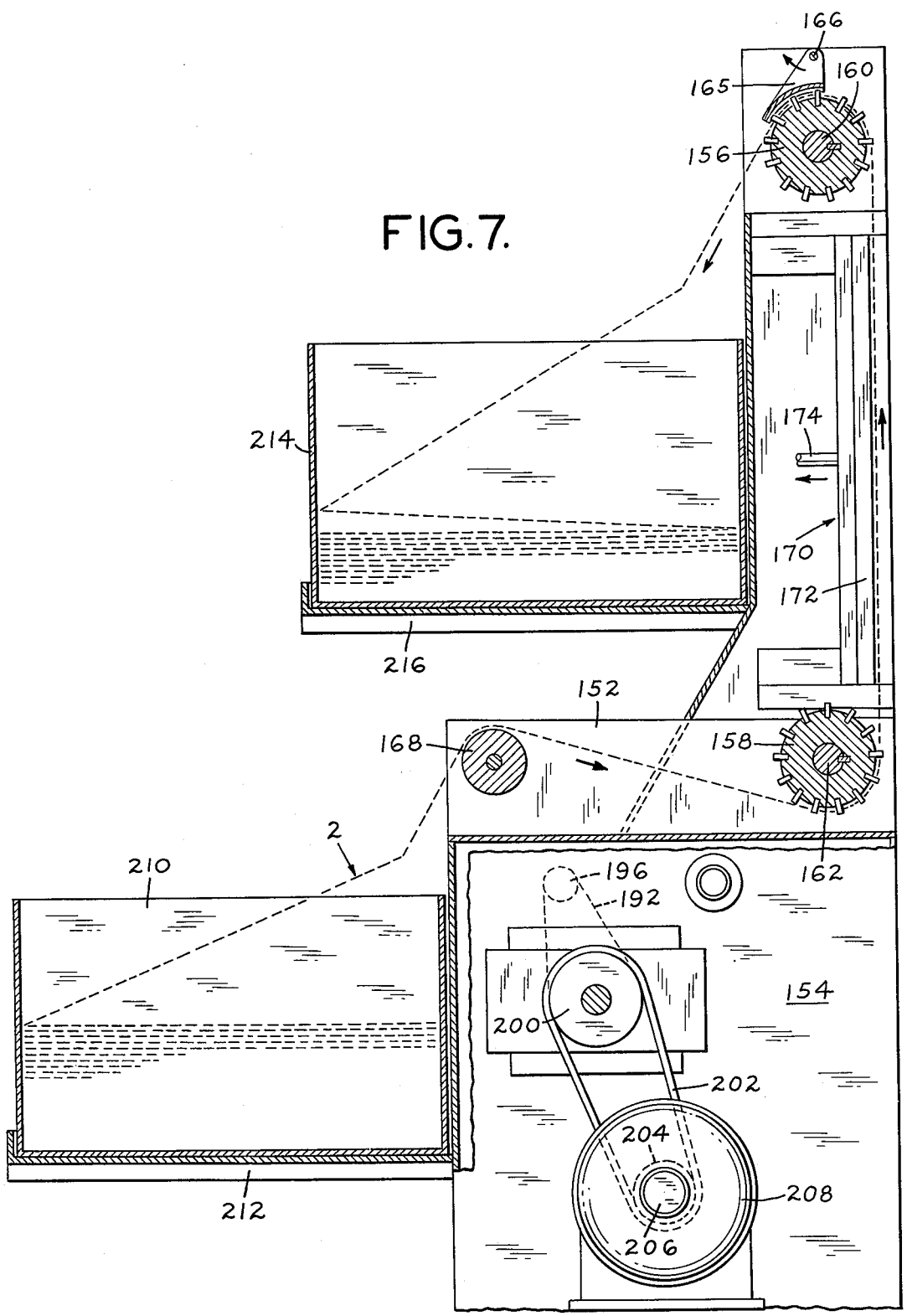
FIG. 7 is a view, partly in section, of the copy board apparatus of FIG. 6, taken at line 7—7, FIG. 6.
Figure 9:
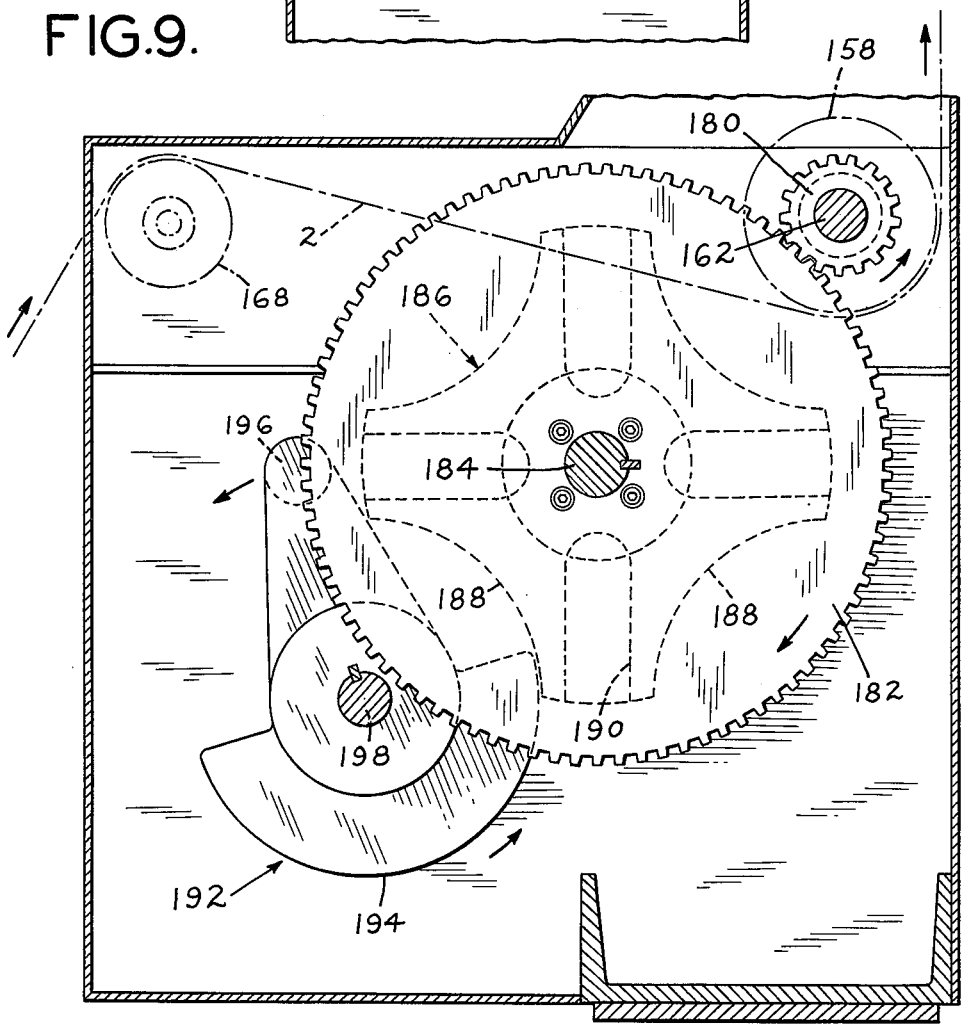
FIG. 9 is an enlarged view of a portion of the machine of FIG. 6 taken at line 9—9, FIG. 6.

Referring to FIGS. 6, 7 and 9, the copy board machine of the instant invention includes a frame, generally designated 150, having side frame members 152, 154. Drive rollers 156, 158 are mounted, respectively, on shafts 160, 162 which, in turn, are mounted on suitable bearings in side frame members 152, 154. At the opposite ends, rollers 156, 158 are mounted, respectively, on shafts 160, 162 which, in turn, are mounted on suitable bearings in side frame members 152, 154. At the opposite ends, rollers 156, 158 are provided with pins for purposes later described. Paper keepers 164, 165, are pivotally mounted at 166, 167 to side frame members 152, 154, respectively, and hold conveyer media 2 on the pins. Roller 168 is mounted on suitable bearings in side frame members 152, 154. Vacuum platen, generally designated 170, having an air pervious plate 172 and connected to a vacuum pump, not shown, by conduit 174, FIG. 7, is mounted between pin drive rollers 156, 158 on side frame members 152, 154. Drive rollers 156, 158 are interconnected by a bevel gear drive, generally designated 176, FIG. 6, connected, respectively, to shafts 160, 162.

Gear 180, FIGS. 6 and 9, is splined to the end of shaft 162 and is in mesh with gear 182, keyed to shaft 184 mounted on suitable bearings in side frame members 152, 154. Geneva starwheel 186, having arcuate shape recesses 188 around its periphery and slots 190, is keyed to shaft 184. Geneva driver 192, having an arcuate shaped portion 194 and a roller 196, is splined to shaft 198 mounted on suitable bearings in side frame members 152, 154. Pulley 200 is keyed to shaft 198 and is connected by belt 202 to pulley 204 keyed to shaft 206 of motor 208. Conveyer media supply box 210 is mounted on shelf 212, FIG. 7, and conveyer media take-up box 214 is mounted on shelf 216. For reasons which are obvious, supply and take-up boxes 130, 134 of the paste-up machine and boxes 212, 214 of the copy machine are identical and interchangeable.

In the operation of the vacuum copy board machine of FIGS. 6, 7 and 9, accordian folded conveyer media 2, with the sorted and arranged book proof pages attached thereto, is placed in supply box 210. The leading end of conveyer media 2 is then threaded over roller 168 and across pin rollers 158, 156. In threading conveyer media 2 across pin roller 156, media 2 is fed between roller 156 and keepers 164, 165. Perforations 4 and 6 on conveyer media 2 are positioned over the pins at the opposite ends of rollers 156, 158 so that such pins, engaged in the perforations, feeds and maintains conveyer media 2 in vertical alignment on the copy board.

Geneva starwheel 186 and Geneva driver 192, as such arm is turned by shaft 198 and motor 208, intermittently turns and intermittently stops rollers 156, 158, first advancing and then stopping conveyer media 2 in position on the copy board. By the gearing connection of the motor and Geneva drive to rollers 156, 158, one segment of conveyer media 2 is transported across and stopped over air pervious platen 172 during each intermittent turning and stopping of rollers 156, 158.

As later described, while stopped and being held in contact with air pervious platen 172, the segment of conveyer media 2, with the book proof pages affixed thereto, is photographed. In order that this might be properly accomplished and the exposures of the book proof pages on the segments will appear in proper position on the photographic film, conveyer media 2, when it is threaded onto the vacuum copy board is positioned with the copy of the first segment to be photographed at a predetermined location on air pervious plate 172. This can be accomplished by aligning adhesive strip 10 on the first segment with pre-set markings on air pervious plate 172. After the first alignment during threading, subsequent segments of conveyer media 2 are each automatically aligned through the Geneva drive.

Figure 10:
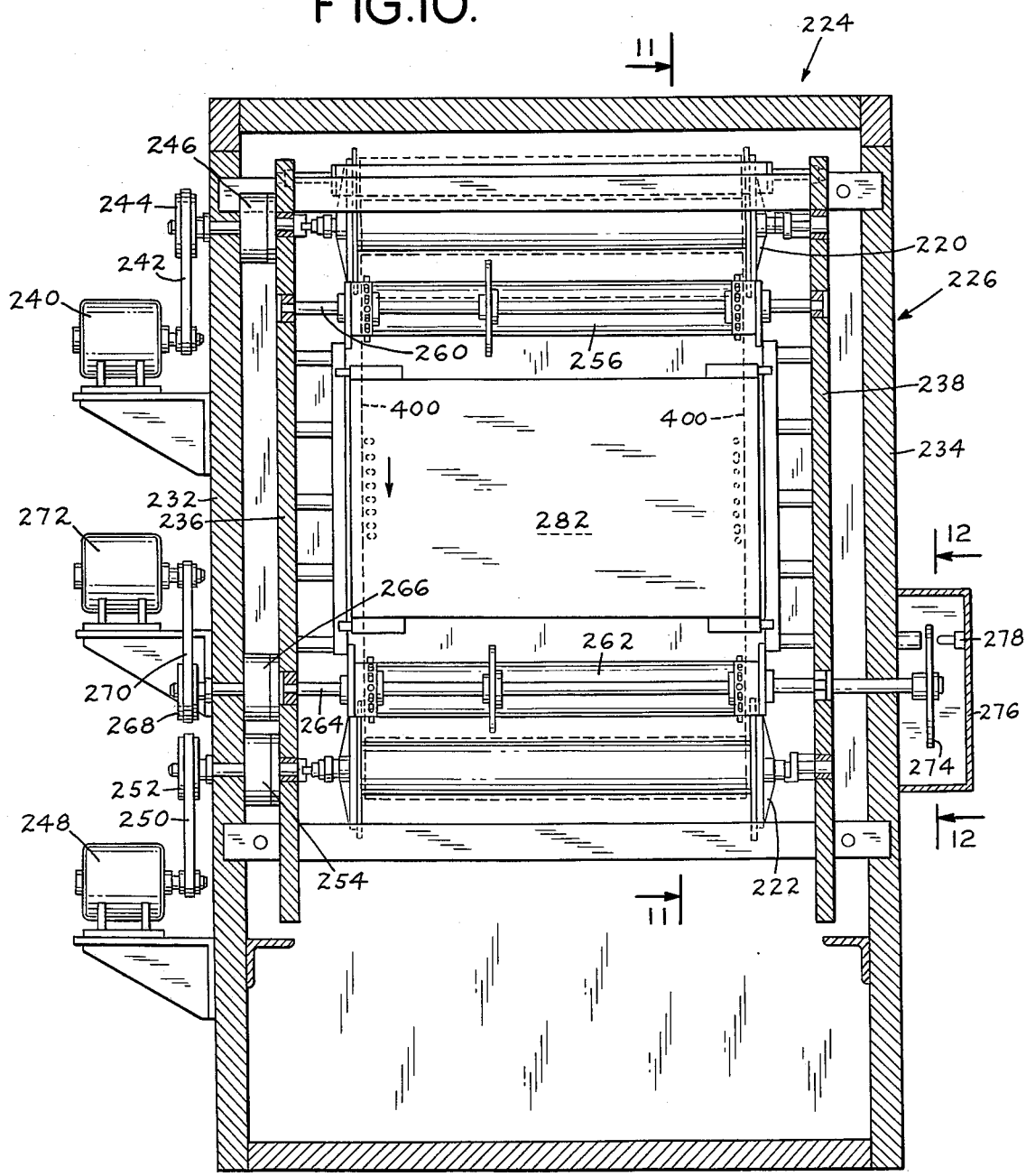
FIG. 10 is a front view, partly in section, taken from the film side of the camera utilized in the instant invention.
Figure 12:
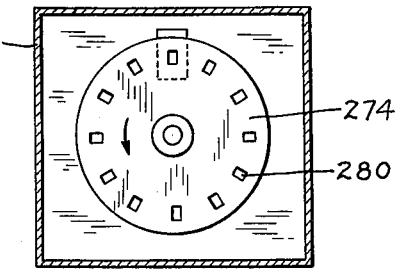
FIG. 12 is a view, partly in section, taken at line 12—12, FIG. 10.
Figure 11:
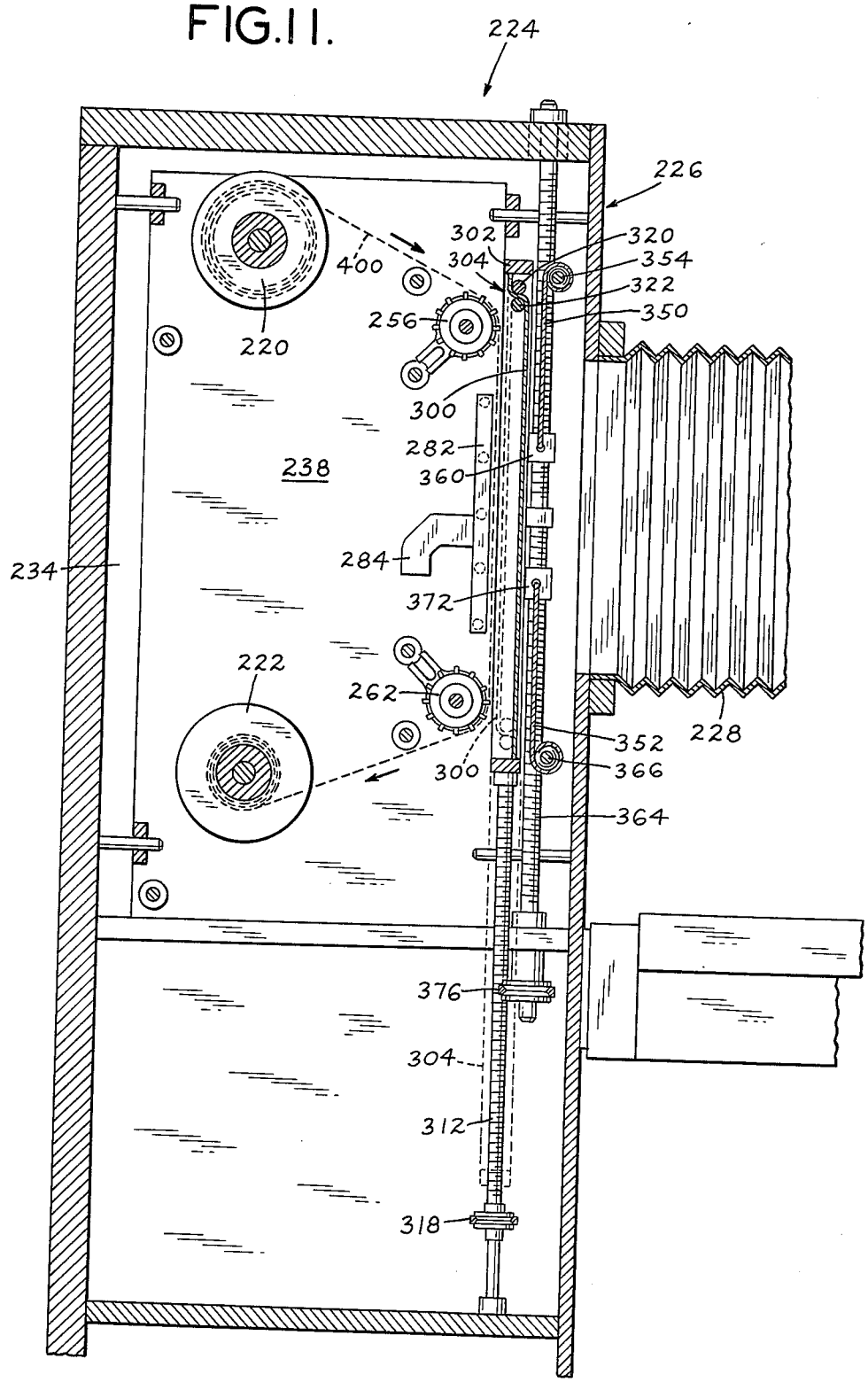
FIG. 11 is a view, partly in section, taken at line 11—11, FIG. 10.

Referring to FIGS. 10 to 14, 16 and 17, the camera utilized in the instant invention employs roll film which, in the camera, is fed from supply reel 220, FIGS. 10 and 11 to take-up reel 222. The camera, generally designated 224, has a housing, generally designated 226, having a conventional bellows 228 and lens 230, FIG. 15. Camera housing 224 has side walls 232, 234 and drive mechanism support walls 236, 238 mounted inside of and supported by the walls of camera housing 226. Film supply reel 220 and take-up reel 222 are mounted in the camera in conventional manner for removal and replacement of the film and film reels and for film feeding. For reasons more apparent hereinafter, supply reel 220 is driven by motor 240, belt 242 and pulley 244, through slip-clutch 246. Take-up reel 222 is driven by motor 248, belt 250, and pulley 252 through slip-clutch 254.

Pin roll 256 is mounted on shaft 260, in turn mounted on suitable bearing in support walls 236, 238. Pin roll 262 is mounted on shaft 264, in turn mounted on suitable bearing in support walls 236, 238. Shaft 264, at one of its ends, is connected to the driven end of clutch 266, driven by pulley 268, belt 270 and motor 272. At its opposite end, shaft 264 is keyed to disc 274 in housing 276 attached to the outer side of side wall 234. Photoelectric cell unit 278 is mounted in housing 276 in alignment with slots 280 in disc 274. Vacuum board 282, having conduit 284 connected to a vacuum pump, not shown, is mounted on support walls 236, 238, with the air pervious face of vacuum board 282 just behind the path of the film fed through camera 224.

Figure 14:
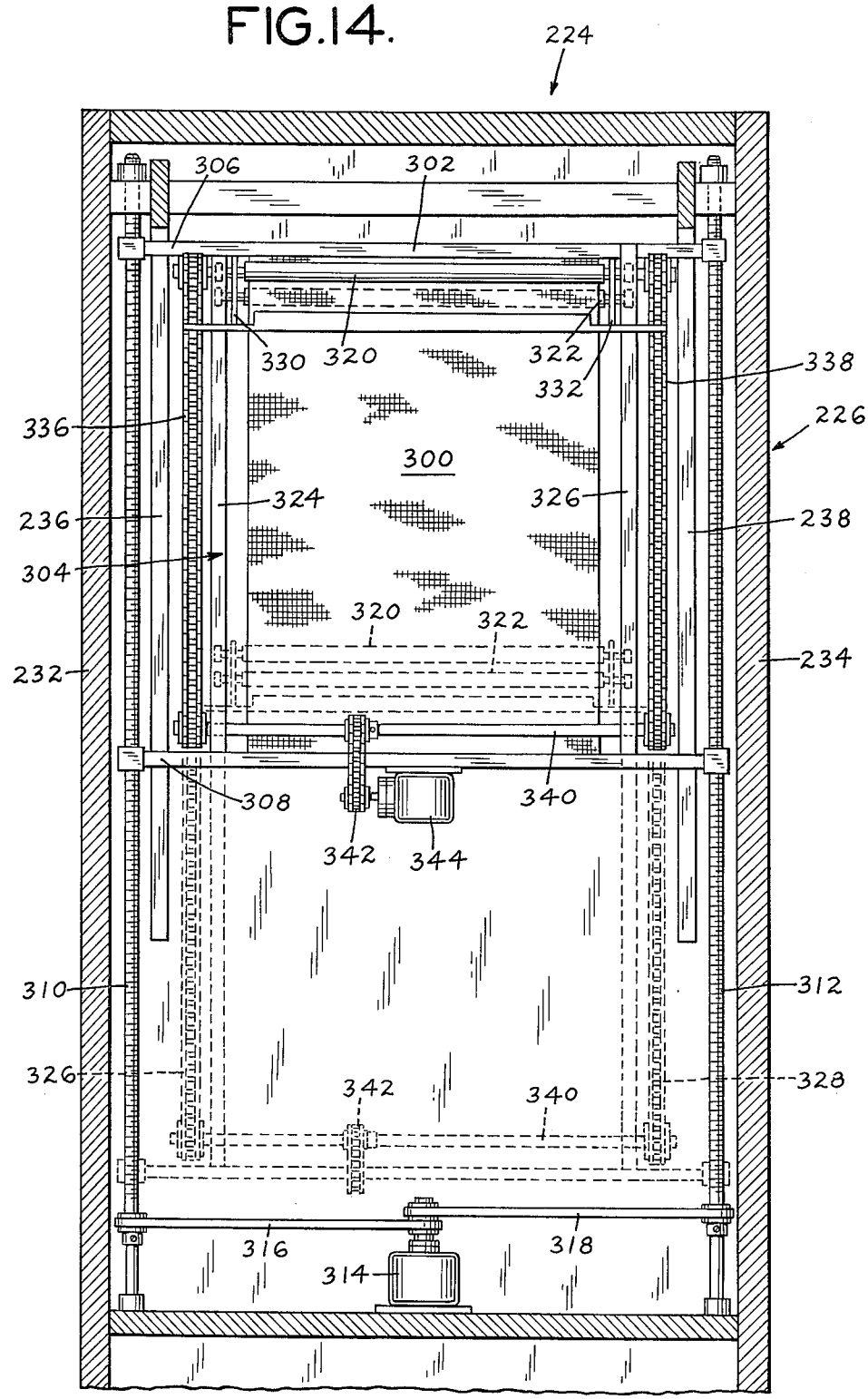
FIG. 14 is a view similar to FIG. 13 but showing other portions of the camera mechanism.

Contact screen 300, FIGS. 11 and 14, is fastened, at its upper end, to the top cross member 302 of screen frame, generally designated 304. Screen frame 304 is fastened at the top and bottom, respectively, to supports 306, 308, threaded at their opposite ends to lead screws 310, 312. Lead screws 310, 312 are driven by motor 314, through belts 316, 318 to raise contact screen 300 and screen frame 304 to position for film contact, shown in full line FIGS. 11 and 14, and to lower such screen and frame to a position in the camera housing below the film and shown in phantom line position in FIGS. 11 and 14.

When screen 300 and frame 304 are in position for film contact, and the film is being fed, screen 300 is held out of position by rollers 320, 322, mounted at their ends in tracks in side members 324, 326 of screen frame 304. The ends of rollers 320, 322 are interconnected by upwardly extending arms 330, 332 on screen actuator 334. The opposite ends of actuator 334 are connected to continuous chains 336, 338 driven, when screen 300 is rolled into contact or rolled out of contact with the film, by shaft 340, chain 342 and motor 344. Motor 344 is reversible and driven in one direction to roll the screen into film contact and in the opposite direction to roll the screen out of contact.

Referring to FIGS. 11 and 13, camera 244, in addition to the conventional shutter, not shown, contains two movable shutters 350, 352. By adjusting these movable shutters, the area of film exposed when the camera shutter is opened can be limited. Shutter 350 is mounted on roller 354, mounted at its ends in side supports 236, 238. At its end, shutter 350 is fastened to actuator member 356 threaded at its ends 358, 360, to lead screws 362, 364. Shutter 352 is mounted on roller 366, mounted at its ends in side supports 236, 238. At its end, shutter 352 is fastened to actuator member 368 threaded at its ends 370, 372, to lead screws 362, 364. Lead screws 362, 364 are driven by belts 374, 376 and motor 380. Motor 380 is reversible and is driven in one direction to open shutters 350, 352 and in the opposite direction to close such shutters.

Figure 16:
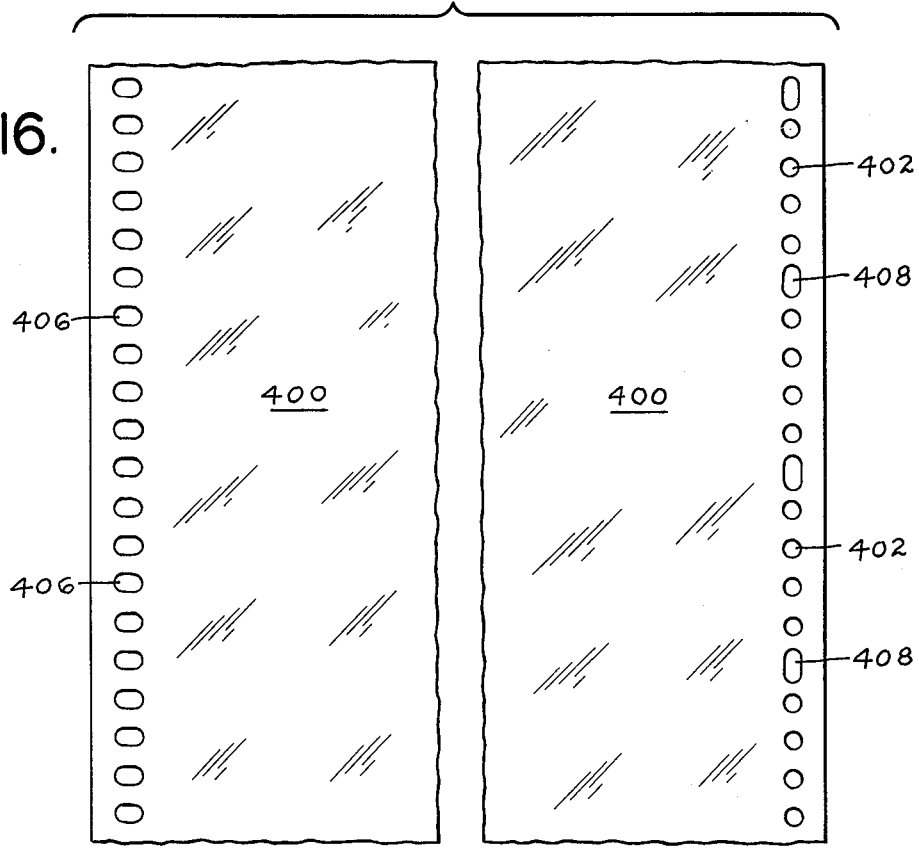
FIG. 16 shows the film utilized in the instant invention.

As best shown in FIG. 16, film 400 utilized in the instant invention is perforated along one edge, adjacent to the film margin, with equally spaced, uniform sized perforations 402, preferably circular perforations. Along the other edge, adjacent to the margin, the film is perforated with a second series of uniform sized, equally spaced perforations 406. Perforations 402 along one edge of the film are aligned, transverse of the film, with perforations 406 along the other edge. Perforations 406, as best shown in FIG. 16, are elongated in a direction transverse to the film and to the direction of film feed in camera 224.

In addition to the uniformed size perforations 402 and for reasons later explained, intermediate equal numbered perforations 402 and in a repeating pattern, film 400 is provided with longitudinally elongated perforations 408.

In inserting a supply reel 220 of film 400 in camera 224 of the instant invention and threading the film through camera 224, perforations 402, 406, 408 in film 400 are placed over and are engaged by the pins on pin rollers 256, 262. Such pins are of substantially the same size and shape as perforations 402 and are of the same longitudinal length but narrower than transversely elongated perforations 406. This engagement of the perforations with the pins assures substantially precise and aligned film transport and, at the same time, because of the transverse clearance between the pins and the elongated perforations 406 allows such film to be drawn into contact with the vacuum face of vacuum board 282.

In utilizing camera 224 in the instant invention, film 400 is transported by pin roll 262 driven by motor 272. For purposes later explained, motor 272 is controlled through disc 274, photoelectric cell unit 278 and slots 280 in disc 274. Motor 248, through slip clutch 254, set to drive when there is slack in the film between pin roll 262 and take-up reel 222 but to otherwise slip, is operated to take-up and wind the film on take-up reel 222.

During the transport of film 400 from supply reel 220 to take-up reel 222 by pin roller 262, motor 240, connected by belt 242, pulley 244 and slip clutch 246 to reel 220 is not utilized. Slip clutch 246 is set so that there is no interference while pin roller 262 is transporting film 400 from the supply to the take-up reel. For certain operations in utilizing the apparatus and methods of the instant invention, as will be described, it is desirable to rewind film 400 after a first exposure back onto supply reel 220. In such operation, motor 240 is energized and film 400 is reverse fed by pin roller 262, motor 272 being reversed for this purpose. Film 400 is rewound back onto reel 220 driven by motor 240 through belt 242, pulley 244 and through slip clutch 246.

Figure 15:
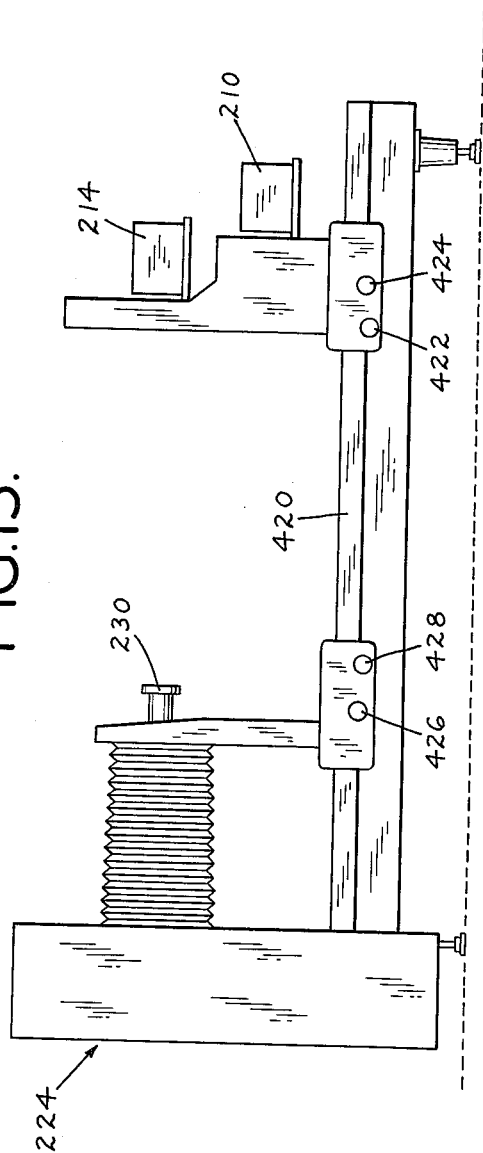
FIG. 15 is a side view of the camera and copy board mounting particularly adapted for use in the instant invention.

Referring to FIG. 15, camera 224 is mounted on one end of bed 420 and the copy board machine is mounted at the opposite end. The copy board machine is mounted, adjusted and locked in position on the bed by adjustments 422, 424. Camera 224 is focused and locked by adjustments 426, 428.

As has already been described, conveyer media 2, with the copy pages affixed thereto at adhesive strip 10, is intermittently fed and stopped, segment by segment, across the surface of air pervious plate 172. The segments are aligned with plate 172. When the segment is stopped, vacuum is applied to air pervious plate 172. Conveyer media 2 and, because of the air pervious character of conveyer media 2, the copy affixed thereto, is drawn into flat contact with plate 172. Such flat contact is important to assure proper focus of the page copy with camera 224 and to minimize, if not eliminate, shadows and shadow lines. Conveyer media 2 and the book proof pages thereon are illuminated with appropriate lighting, positioned in conventional manner for clear photo-reproduction.

As each segment of conveyer media 2 is stopped and drawn by vacuum into flat contact on plate 172, a picture is taken of each segment on film 400 in camera 224 and the image of the copy on the book proof pages is produced on the film. After processing, the film so produced is used for contact printing of blueprint book proof copies and for contact reproduction of the images on the photosensitive printing plate. Hence, precise position of the images on the film and the film length between such images is critical.

In the instant invention, transverse positioning of the book proof page images on film 400 is fixed by the positioning of the book proof pages on conveyer media 2. Longitudinal positioning of the images on the film is controlled by the length of film feed in camera 224 between image exposures. To attain precise positioning, conveyer media 2 on the paste-up machine and on the vacuum copy board machine, and film 400 must be precisely transported and positioned. Such precise transport and positioning of conveyer media 2 is controlled by the longitudinal perforations 4, 6 on conveyer media 2 and the engagement of such perforations by the pins on pin rollers 18, 24 of the paste-up machine and by the pins on pin rollers 156, 158 of the copy board machine. The pins engaging perforations 4 are substantially the same size and shape of the perforations. The pins engaging perforations 6 are substantially the same length of perforations 6 but, in the transverse direction, are narrower than the perforations. Thus, the transverse clearance between perforations 6 and the pins prevents buckling of conveyer media 2 should there be any expansion or contraction transverse the sheets. In camera 224, the pins on pin rollers 256, 262 engage perforations 402, 406 in film 400 in a similar fashion.

The pins on pin rollers 18, 24 of the paste-up machine, pins on pin rollers 156, 158 of the copy board machine and pins on pin rollers 256, 262 of camera 224 are all, preferably, of the retractable type. The pins are withdrawn into or flush with the periphery of the rollers when out of engagement with conveyer media 2 or film 400, as the case may be, and are advanced outwardly of the roller periphery to engage the perforations. In this way, the pins on the pin rollers are brought into engagement with the perforations without interfering with the conveyer media or film feed and without damage to the conveyer media or film perforations. The pins are withdrawn and advanced with a cam mounted in an adjusted stationary position adjacent to the ends of the respective pin rollers.

The longitudinal positioning of the copy page images on film 400 is controlled in camera 224 by film transport pin roller 262, driven by motor 272. Motor 272 is controlled by photoelectric cell unit 278, disc 274 and slots 280 in disc 274. Photoelectric cell unit 278 is programmed so that, after each image exposure and when motor 272 is energized, the motor, film feed pin roller 262 and the feed of film 400 will be stopped after a predetermined number of photo-cell impulses. The number of impulses programmed into the apparatus may be constant or may be varied, depending upon how the longitudinal spacing of the images is desired or required on the printing plate to be photosensitized. Movable shutters 350, 352 are adjusted to the length of pages to be reproduced so that, when film 400 in camera 224 is exposed, the area of the film strip above and below the page exposure area is not exposed or re-exposed.

After film 400 has been exposed, the roll of film is removed from camera 224, and processed in conventional manner. After processing, such film may be rewound on a reel for storage and subsequent handling. This eliminates the inconveniences and expenses of handling and storing flat film sheets as has heretofore been the practice.

Film 400, after processing, is unwound from the storage reel, and inspected for light holes and defects. Any light holes or defects are corrected, such as with an opaque material, and the film is rewound on a reel. If desired, while this is being done, the film can be partially cut into the desired length for printing plate reproduction. Such partial cutting of the film into length allows such film to be rewound and stored on a reel for easy storage and handling but, at the same time, facilitates the removal of printing plate reproduction lengths when this is desirable.

The width of printing presses and photosensitized printing plates used thereon for multi-page printing, such as in the printing of books, varies. Some printing presses and printing plates are relatively narrow, printing only one signature impression after the other on a continuous paper web. Other printing presses and printing plates are relatively wide, printing a plurality of signature impressions in rows, side by side across the press and plate while, at the same time, within the rows, printing one signature impression after the other on a continuous web.

Film 400, in the instant invention, is of a width for the making of blueprint book proof page copies and for photosensitizing printing plates one signature impression wide. Film 400 is also adapted for use for photosensitizing printing plates for side by side signature impression printing.

For making blueprint book proof page copies, the processed film 400 may be cut into printing plate lengths and blueprints may be prepared from such cut lengths in the same manner as heretofore employed in the making of blueprint copies. Preferably, in the instant invention, blueprint book proof page copies are made from processed film without cutting such film into printing plate lengths but, rather, from the rolled film. Thus, in the making of blueprint copies, the processed film is unreeled from one reel, fed through the blueprint machine and is re-reeled onto a take-up reel. This facilitates the handling of the film during blueprinting and storage of the film prior to photosensitizing the printing plates.

In feeding the rolled film through the blueprint machine, blueprint copies can be made on the opposite sides of the blueprint paper. This is accomplished, in the instant invention, by feeding one strip of developed and processed film through the blueprint machine over one surface of the blueprint paper and, at the same time, feeding a second strip of developed and processed film over the opposite side of the blueprint paper. The signature images on the two strips of film are registered with each other and are fed in registry through the blueprint machine with the perforations along the edges of the films. By registering the signature impressions, the blueprint copy, when folded, bound and trimmed, will contain the blueprint impressions in proper page sequence and in proper position on the blueprint pages. As is obvious, in sorting and arranging the pages and in placing and attaching such pages to conveyer media 2 on the paste-up machine, the pages must be programmed for simultaneous blueprinting.

In the preparation of film 400, in the instant invention, for use in exposing printing plates for the printing of text line copy pages, one exposure of the film for the text or line copy pages is required. Where, as in the case of a book or publication which will contain pictures, half toning of the picture on the printing plate is required, a suitable print of the picture which will photographically reproduce as a half tone images on film 400 may be employed. In such instances, the half tone producing print may be sorted, arranged and attached to conveyer media 2, along with the text or line copy pages, and only one exposure of the film is required. Where a half tone producing print of the picture is not available or desirable, the half tone impression of the picture may be made on film 400 in the manner to be described.

In producing half tone images directly on film 400 from a conventional, continuous tone picture, the text or line copy pages are sorted, arranged and positioned on conveyer media 2 and the images thereof are photographically recorded on film 400 in the one exposure film sequence as heretofore described. At the page position where the photograph to be half toned is to appear, a non-exposure producing mask, such as a non-reflective black sheet, is affixed to conveyer media 2. Thus, when the segment of conveyer media 2 is positioned on the copy board and film 400 is exposed, latent images of the text or line copy pages are photographically produced on film 400 and, a non-exposed area, at the mask position, remains on such film. After the text or line copy page photography has been completed, film 400 is rewound from take-up roll 222 and back onto film supply roll 220. The photograph to be half tone reproduced on film 400 is placed on the copy board in the position occupied by the mask during the first exposure of film 400 and non-exposure producing masks. A non-light reflecting black paper, is now placed over the copy board in those areas where the text or copy pages had been exposed. This can be done on conveyer media 2 on the paste-up machine by affixing masks at the text or copy page positions and fixing the photograph to the segment at the photograph position and then positioning such segment on the copy board. With the masks and photographs in position on the copy board, film 400 is again transported through camera 224 from supply roll 220 to take-up roll 222 by pin roller 262 and motor 272. Photoelectric cell unit 278 is programmed to stop the film when the unexposed area and the latent page impressions of the text pages on film 400 are in alignment with the copy board. Screen frame 304 carrying half tone contact screen 300 is raised to the full line position in FIG. 11 and half tone contact screen 300 is brought into contact with the film with rollers 320, 322. The lens of camera 224 is opened, and the un-exposed area on film 400 is exposed following conventional half toning procedures. A latent half tone image of the picture is, thus, formed on film 400. Because of the masks at the text on book proof page copy positions, the latent images of the copy pages already recorded on film 400 are not re-exposed or effected during the second exposure producing the latene half tone image. After the latent half tone image has been recorded, the lens of camera 224 is closed and the film is wound onto take-up roll 222, processed and used in the preparation of the blueprints and photosensitizing of the printing plates in the manner already described.

In the method and apparatus of the instant invention, film 400 may be advanced, exposed, rewound, readvanced and re-exposed any number of times. Masking techniques commercially utilized in the photographic arts may be employed in the instant invention to provide un-exposed areas or to prevent areas already exposed and containing latent images from being re-exposed. The advancing and rewinding of film 400 is controlled through photoelectric cell 278, disk 274 and disk slots 280 which, when programmed, advance the film to the required registry positions.

In utilizing film 400 of the instant invention, after such film has been exposed, as hereinbefore described, and processed, for photosensitizing printing places for use on printing presses where a plurality of signature impositions are printed in rows, side by side across the press and plate, the printing plate is simultaneously photosensitized with a plurality of strips of film 400. In order to accomplish this, the film strips are placed side by side and aligned. To expedite such side by side positioning and alignment of the film for photosensitizing such wide plates a template is provided in the instant invention.

Figure 17:
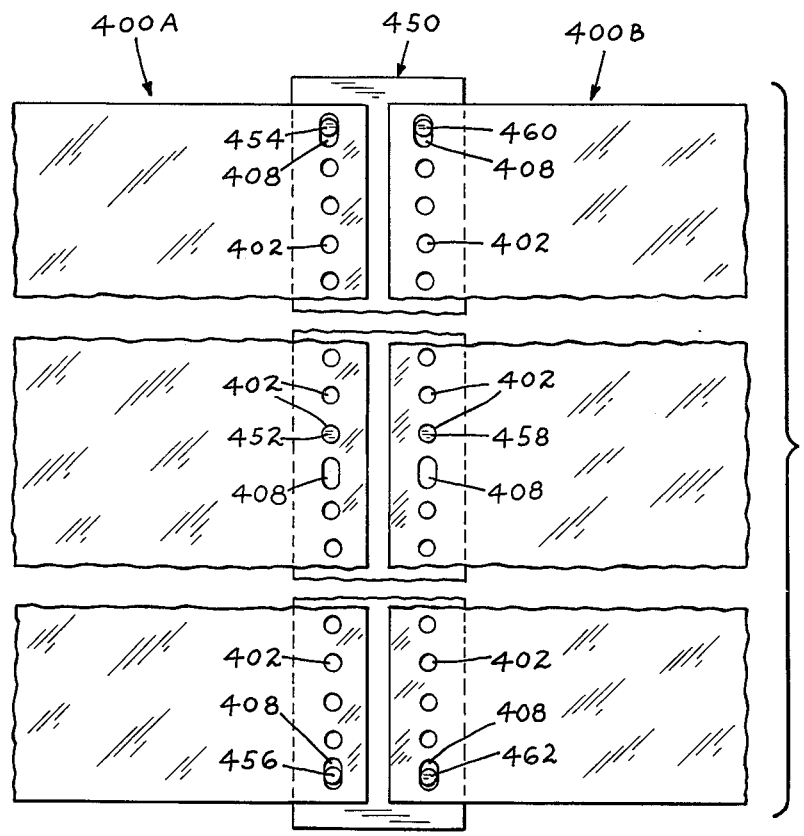
FIG. 17 shows the parallel mounting and alignment of the film strips of the instant invention.

As best shown in FIG. 17, template 450, which may be of metal, plastic or other suitable material and which is photographically opaque, has two rows of longitudinally aligned and spaced pins 452, 454, 456 and 458, 460, 462. For purposes which will be explained, pins 452 and 458 are aligned transversely of template 450, at or near the longitudinal central position of template 450. Pins 454, 456 are spaced from pin 452 and pins 460, 462 are spaced from pin 458 so that, when a round perforation 402, along the side edge of film 400, is positioned over pins 452, 458, pins 454, 456 and pins 460, 462 will be positioned in a slotted perforation 408. By this pin and slot perforation arrangement, any shrinkage or expansion that may have occurred in the respective strips of films 400 to be aligned will not result in wrinkling or bulging of the aligned film strips.

In mounting strips of film 400 on template 450, the circular perforations 402 and elongated perforations 408 are utilized. Film strips 400A of film 400 is placed on template 450 by aligning a circular hole at or near the center of the strip with circular pin 452. Preferably, the pins on template 450 are slightly larger, at the upper end of the pins, than the film perforations, so that the perforation can be pushed down over the pin, without damage to the film. Once pushed over the pin, film strip 400A is held flat on template 450 by pin 452 in circular perforation 402 and by pins 454, 456 in elongated perforations 408. Film strip 400B of film 400 is pushed down over pins 458, 460, 462 in a similar manner. With film strips 400A and 400B on template 450, the printing plate for side by side signature imposition printing can be photosensitized.

From the foregoing description, it can be seen that the method and apparatus substantially simplifies the organization and preparation of photogenerated printing media for multi-page printing where different images, such as in the printing of books, are to be printed. The planning and execution of the lay-outs are substantially simplified and the possibility of mistakes which can cause difficulties and expense in correction during the latter stages are substantially reduced. The need for large areas for preparing and storing large sheets, as was heretofore the practice, are eliminated as is the handling and possible damage to such larger sheets.

The terms and expressions which have been employed are used as terms of description and not of limitation, and there is no intention, in the use of such terms and expressions, of excluding any equivalents of the features shown and described or portions thereof, but it is recognized that various modifications are possible within the scope of the invention claimed.

What is claimed:

1. A method for preparing proof copy page lay-outs for multi-page printing comprising the steps of recording at predetermined spaced intervals on a film the page sequence in which such pages are to be printed, advancing a conveyer sheet through a first conveyer sheet holder and stopping said sheet in said first holder after a predetermined length of said conveyer sheet has been advanced, advancing said recorded film a predetermined length to expose said film for viewing of the intervals of said page printing sequence and stopping said film, after stopping the advance of said conveyer sheet and said film affixing to said conveyer sheet at pre-determined intervals across said conveyer sheet and in the sequence exposed for viewing on said film the proof copy pages of the pages to be printed, after said proof copy pages have been affixed to said conveyer sheet, advancing said conveyer sheet with said proof copy pages affixing thereto through a second conveyer sheet holder and stopping said conveyer sheet in said second conveyer sheet holder after a pre-set segment length of said conveyer sheet has been advanced through said second sheet holder, advancing a pre-set length of photosensitive film and stopping said photosensitive film and, after each pre-set segment of said conveyer sheet and said pre-set length of said pre-set length of said photosensitive film have been advanced and while said conveyer sheet is stopped in said second sheet holder and said photosensitive film is stopped, reproducing the images of said proof copy pages affixed to said conveyer sheet onto said photosensitive film and, thereafter, reproducing the images of said proof page copy on said photosensitive film onto a printing plate for use in said multi-page printing.

* * * * *